(12) United States Patent
Roh et al.

(10) Patent No.: US 12,063,860 B2
(45) Date of Patent: Aug. 13, 2024

(54) THERMOELECTRIC ELEMENT

(71) Applicant: LG INNOTEK CO., LTD., Seoul (KR)

(72) Inventors: Myoung Lae Roh, Seoul (KR); Jong Min Lee, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 77 days.

(21) Appl. No.: 17/041,695

(22) PCT Filed: Apr. 2, 2019

(86) PCT No.: PCT/KR2019/003878
§ 371 (c)(1),
(2) Date: Sep. 25, 2020

(87) PCT Pub. No.: WO2019/194539
PCT Pub. Date: Oct. 10, 2019

(65) Prior Publication Data
US 2021/0050504 A1    Feb. 18, 2021

(30) Foreign Application Priority Data

Apr. 4, 2018 (KR) .................. 10-2018-0039307
Mar. 28, 2019 (KR) .................. 10-2019-0036097

(51) Int. Cl.
*H10N 10/856* (2023.01)
*H10N 10/17* (2023.01)
*H10N 10/817* (2023.01)

(52) U.S. Cl.
CPC .......... *H10N 10/17* (2023.02); *H10N 10/856* (2023.02)

(58) Field of Classification Search
CPC ....... H01L 35/32; H10N 10/17; H10N 10/856
See application file for complete search history.

(56) References Cited

U.S. PATENT DOCUMENTS

| 6,444,893 B1 * | 9/2002 | Onoue ............... H10N 10/13 136/203 |
| 2002/0162338 A1 * | 11/2002 | Shimada ............ H01L 23/38 257/E23.114 |

(Continued)

FOREIGN PATENT DOCUMENTS

| JP | 11-168245 | 6/1999 |
| JP | 2002-199608 | 7/2002 |

(Continued)

OTHER PUBLICATIONS

JP2016092027, English translation, 2016.*

(Continued)

*Primary Examiner* — Uyen M Tran
(74) *Attorney, Agent, or Firm* — KED & Associates LLP

(57) ABSTRACT

A thermoelectric element according to an embodiment of the present invention comprises: a first metal substrate; a first resin layer disposed on the first metal substrate and in direct contact with the first metal substrate; a plurality of first electrodes disposed on the first resin layer; a plurality of thermoelectric legs disposed on the plurality of first electrodes; a plurality of second electrodes disposed on the plurality of thermoelectric legs; a second resin layer disposed on the plurality of second electrodes; and a second metal substrate disposed on the second resin layer, wherein the first resin layer comprises a polymeric resin and an inorganic filler and at least a part of side surfaces of the plurality of first electrodes are embedded in the first resin layer.

13 Claims, 8 Drawing Sheets

(56) References Cited

U.S. PATENT DOCUMENTS

| | | | |
|---|---|---|---|
| 2003/0127725 A1 | 7/2003 | Sugaya et al. | |
| 2005/0001331 A1 | 1/2005 | Kojima et al. | |
| 2009/0236087 A1* | 9/2009 | Horio | H01L 35/30 |
| | | | 165/185 |
| 2011/0290293 A1* | 12/2011 | Kim | H01L 35/08 |
| | | | 438/54 |
| 2012/0042921 A1 | 2/2012 | Kim et al. | |
| 2013/0014516 A1 | 1/2013 | Yang et al. | |
| 2013/0014795 A1* | 1/2013 | Yang | H10N 10/13 |
| | | | 136/200 |
| 2013/0081663 A1 | 4/2013 | Yang et al. | |
| 2015/0311420 A1* | 10/2015 | Akabane | H10N 10/17 |
| | | | 136/203 |
| 2015/0333246 A1* | 11/2015 | Lee | H10N 10/17 |
| | | | 136/205 |
| 2016/0005948 A1 | 1/2016 | Hayashi et al. | |
| 2016/0284963 A1 | 9/2016 | Takeda et al. | |
| 2020/0388740 A1* | 12/2020 | Toyoshima | H10N 10/13 |

FOREIGN PATENT DOCUMENTS

| | | |
|---|---|---|
| JP | 2003-046147 | 2/2003 |
| JP | 2005-340565 | 12/2005 |
| JP | 2007-035974 | 2/2007 |
| JP | 2014-222603 | 11/2014 |
| JP | 2016-092027 | 5/2016 |
| KR | 10-2010-0030071 | 3/2010 |
| KR | 10-2016-0105349 | 9/2016 |
| KR | 10-2016-0117944 | 10/2016 |
| KR | 10-2016-0126805 | 11/2016 |
| TW | I621866 | 4/2018 |

OTHER PUBLICATIONS

JP2005340565, English translation, 2005.*
European Search Report dated Nov. 10, 2021 issued in Application No. 19781406.4.
Korean Office Action dated Nov. 23, 2020 issued in Application No. 10-2020-0035660.
International Search Report dated Jul. 9, 2019 issued in Application No. PCT/KR2019/003878.
Chinese Office Action dated Mar. 25, 2023 issued in Application No. 201980024692.4.
Japanese Office Action dated May 30, 2023 issued in Application No. 2020-553583.
Extended European Search Report dated Dec. 8, 2023, issued in Application No. 23200135.4.

* cited by examiner

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2019/003878, filed Apr. 2, 2019, which claims priority to Korean Patent Application Nos. 10-2018-0039307, filed Apr. 4, 2018 and 10-2019-0036097, filed Mar. 28, 2019, whose entire disclosures are hereby incorporated by reference.

TECHNICAL FIELD

The present invention relates to a thermoelectric element, and more specifically, to a bonding structure of a thermoelectric element.

BACKGROUND ART

A thermoelectric phenomenon is a phenomenon which occurs by movement of electrons and holes in a material, and refers to direct energy conversion between heat and electricity.

A thermoelectric element is a generic term for a device using the thermoelectric phenomenon, and has a structure in which a P-type thermoelectric material and an N-type thermoelectric material are joined between metal electrodes to form a PN junction pair.

Thermoelectric elements may be classified into a device using temperature changes of an electrical resistance, a device using the Seebeck effect, which is a phenomenon in which an electromotive force is generated due to a temperature difference, a device using the Peltier effect, which is a phenomenon in which heat absorption or heat generation by current occurs, and the like.

The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element increases more and more.

The thermoelectric element includes substrates, electrodes, and thermoelectric legs, a plurality of thermoelectric legs are disposed in an array shape between an upper substrate and a lower substrate, a plurality of upper electrodes are disposed between the plurality of thermoelectric legs and the upper substrate, and a plurality of lower electrodes are disposed between the plurality of thermoelectric legs and the lower substrate.

Generally, the thermoelectric element may be disposed on a metal support. When the upper and lower substrates included in the thermoelectric element are ceramic substrates, heat loss may occur due to thermal resistance at interfaces between the ceramic substrates and the metal support.

DISCLOSURE

Technical Problem

The present invention is directed to providing a bonding structure of a thermoelectric element.

Technical Solution

One aspect of the present invention provides a thermoelectric element including: a first metal substrate; a first resin layer which is disposed on the first metal substrate and in direct contact with the first metal substrate; a plurality of first electrodes disposed on the first resin layer; a plurality of thermoelectric legs disposed on the plurality of first electrodes; a plurality of second electrodes disposed on the plurality of thermoelectric legs; a second resin layer disposed on the plurality of second electrodes; and a second metal substrate disposed on the second resin layer, wherein the first resin layer includes a polymer resin and an inorganic filler, and at least some of side surfaces of the plurality of first electrodes are embedded in the first resin layer.

Heights of the side surfaces embedded in the first resin layer may be 0.1 to 1 time a thickness of each of the plurality of first electrodes.

A thickness of the first resin layer between two neighboring first electrodes may decrease from the side surfaces of the first electrodes to a center region between the two neighboring first electrodes.

A thickness of the first resin layer under the plurality of first electrodes may be smaller than the thickness of the first resin layer at the center region between the two neighboring first electrodes.

A distribution of the inorganic filler in the first resin layer under the plurality of first electrodes may be different from a distribution of the inorganic filler in the first resin layer between the two neighboring first electrodes.

A particle size (D50) of the inorganic filler in the first resin layer under the plurality of first electrodes may be smaller than a particle size (D50) of the inorganic filler in the first resin layer between the two neighboring first electrodes.

A surface of the first metal substrate facing the first resin layer may include a first region and a second region disposed in the first region, a surface roughness of the second region may be greater than a surface roughness of the first region, and the first resin layer may be disposed on the second region.

The thermoelectric element may further include a sealing part disposed between the first metal substrate and the second metal substrate, wherein the sealing part may be disposed on the first region.

The sealing part may include a sealing case disposed to be spaced apart from a side surface of the first resin layer and a side surface of the second resin layer by a predetermined distance, and a sealing material disposed between the sealing case and the first region.

The first resin layer may include the polymer resin in an amount of 20 to 40 wt % and the inorganic filler in an amount of 60 to 80 wt %.

The polymer resin may include at least one of an epoxy resin, an acrylic resin, a urethane resin, a polyamide resin, a polyethylene resin, an ethylene-vinyl acetate copolymer (EVA) resin, a polyester resin, and a polyvinyl chloride (PVC) resin, and the inorganic filler may include at least one of aluminum oxide, boron nitride, and aluminum nitride.

The second resin layer and the first resin layer may include the same material.

Advantageous Effects

According to an embodiment of the present invention, a thermoelectric element having excellent thermal conductivity, low heat loss, and high reliability can be obtained. Specifically, the thermoelectric element according to the embodiment of the present invention has a high bonding strength with a metal support and a simple manufacturing process.

MODES OF THE INVENTION

Figure 1:
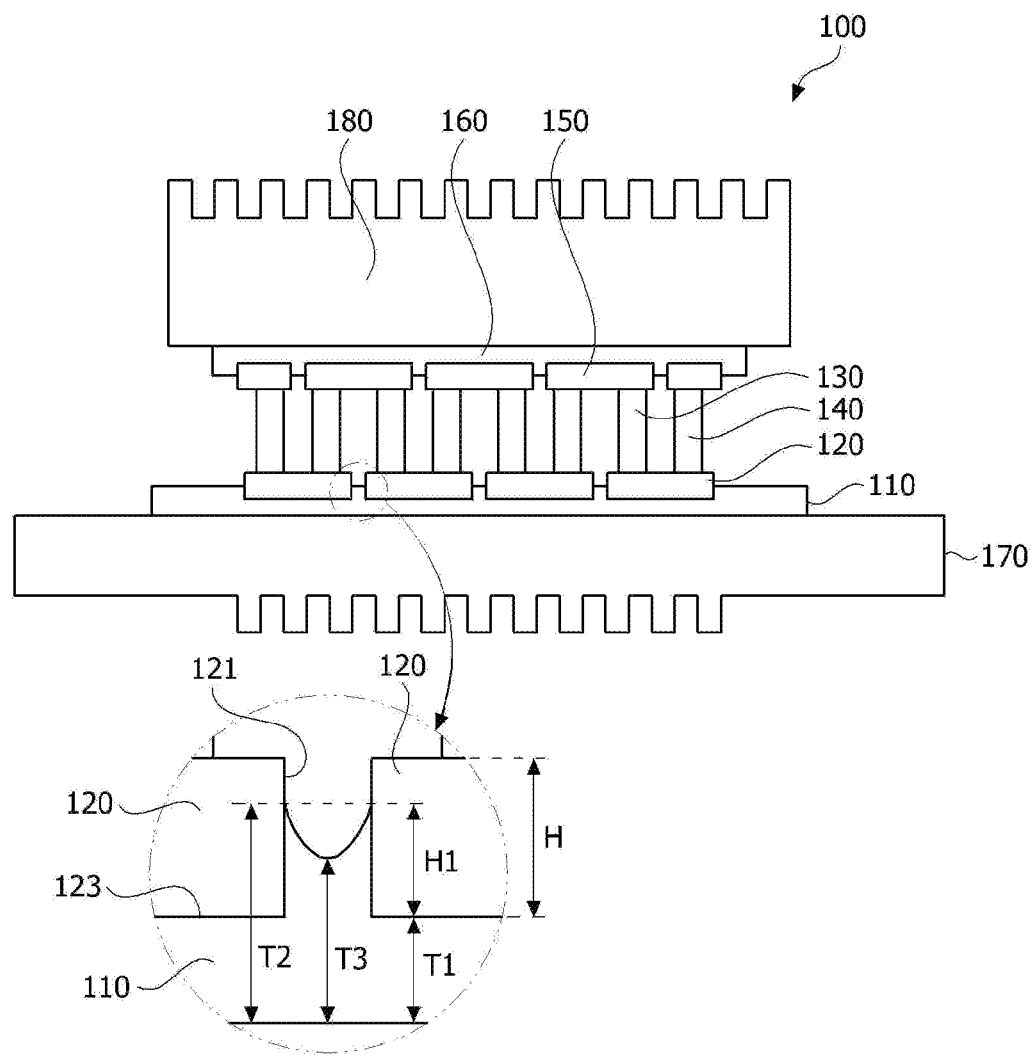
FIG. 1 is a cross-sectional view of a thermoelectric element according to one embodiment of the present invention.

Since the present invention may be variously changed and have various embodiments, particular embodiments will be exemplified and described in the drawings. However, the present invention is not limited to the particular embodiments and includes all changes, equivalents, and substitutes within the spirit and the scope of the present invention.

Further, it should be understood that, although the terms "second," "first," and the like may be used herein to describe various elements, the elements are not limited by the terms. The terms are only used to distinguish one element from another. For example, a first element could be termed a second element, and similarly, a second element could be termed a first element without departing from the scope of the present invention. The term "and/or" includes any one or any combination among a plurality of associated listed items.

When predetermined components are mentioned as being "linked," or "connected" to other components, the components may be directly linked or connected to other components, but it should be understood that additional components may be present therebetween. On the other hand, when the predetermined components are mentioned as being "directly linked," or "directly connected" to other components, it should be understood that no additional components are present between the above-described components.

Terms used in the present invention are used solely to describe the particular embodiments and not to limit the present invention. The singular form is intended to also include the plural form, unless the context clearly indicates otherwise. It should be further understood that the terms "include," "including," "provide," "providing," "have," and/or "having" specify the presence of stated features, integers, steps, operations, elements, components, and/or groups thereof but do not preclude the presence or addition of one or more other features, integers, steps, operations, elements, components, and/or groups thereof.

Unless otherwise defined, all terms including technical or scientific terms used in the present invention have meanings which are the same as those of terms generally understood by those skilled in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the embodiments will be described in detail with reference to the accompanying drawing drawings, the same reference numerals are applied to the same or corresponding elements, and redundant description thereof will be omitted.

Figure 2:
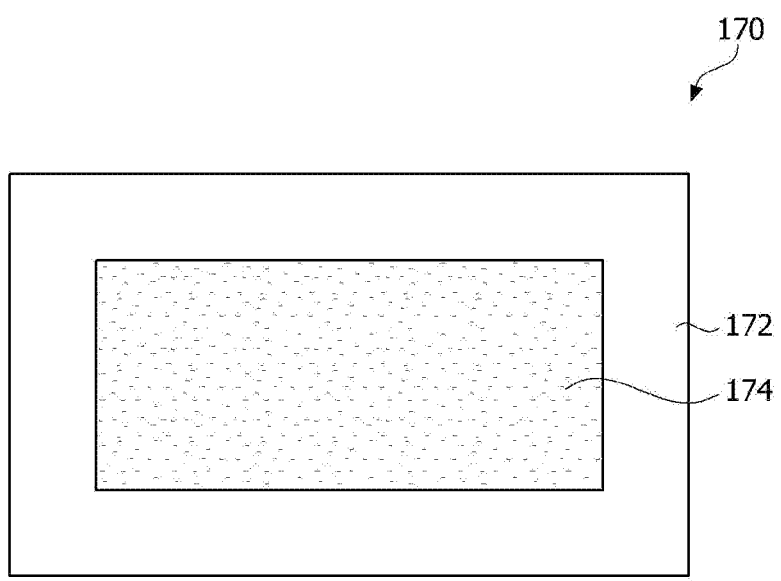
FIG. 2 is a top view of a metal substrate included in the thermoelectric element according to one embodiment of the present invention.
Figure 3:
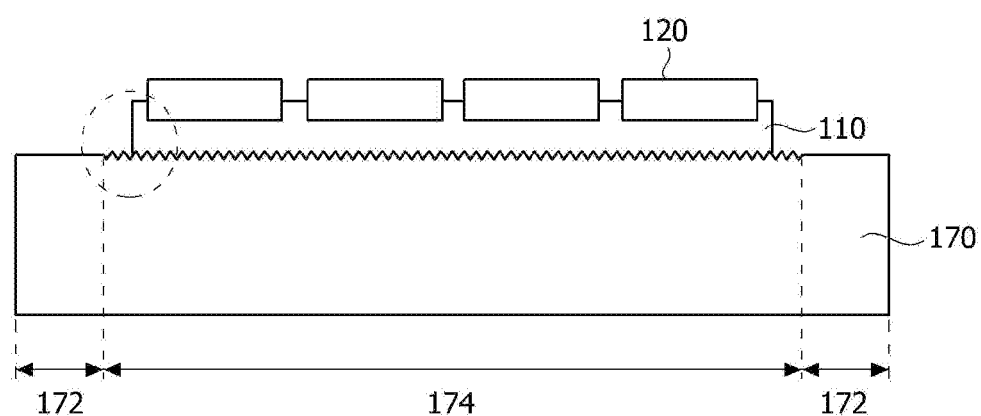
FIG. 3 is a cross-sectional view of a metal substrate of the thermoelectric element according to one embodiment of the present invention.
Figure 4:
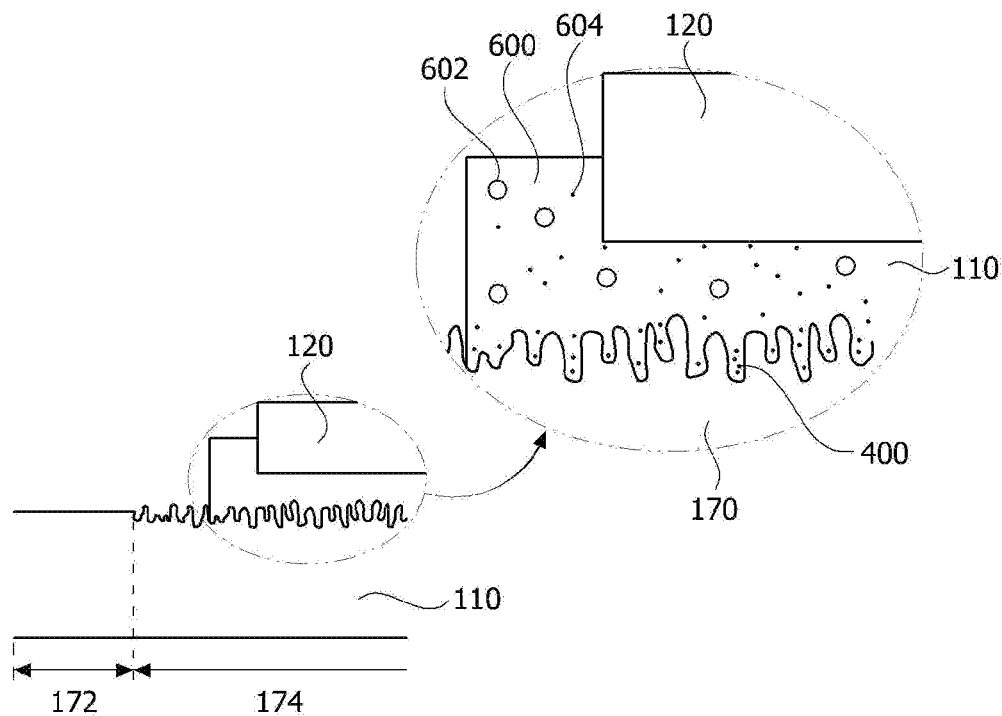
FIG. 4 is an enlarged view of one region in FIG. 3.
Figure 5:
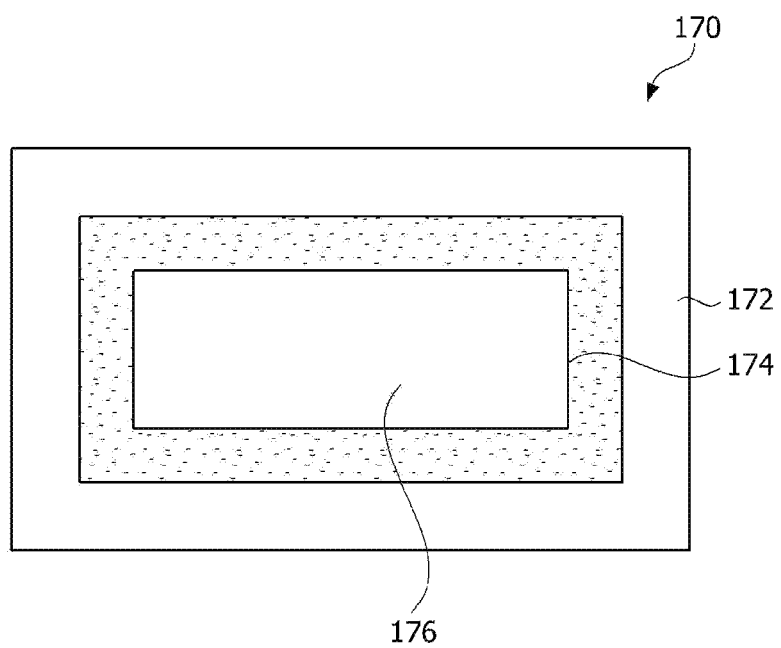
FIG. 5 is a top view of a metal substrate included in a thermoelectric element according to another embodiment of the present invention.
Figure 6:
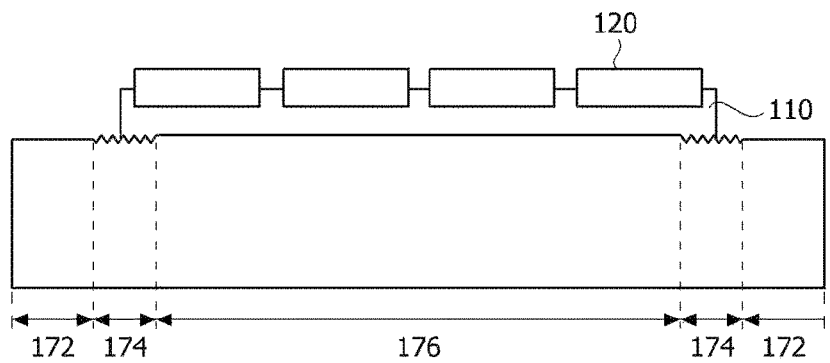
FIG. 6 is a cross-sectional view of a metal substrate of the thermoelectric element including the metal substrate in FIG. 5.

FIG. 1 is a cross-sectional view of a thermoelectric element according to one embodiment of the present invention, FIG. 2 is a top view of a metal substrate included in the thermoelectric element according to one embodiment of the present invention, FIG. 3 is a cross-sectional view of a metal substrate of the thermoelectric element according to one embodiment of the present invention, and FIG. 4 is an enlarged view of one region in FIG. 3. FIG. 5 is a top view of a metal substrate included in a thermoelectric element according to another embodiment of the present invention, and FIG. 6 is a cross-sectional view of a metal substrate of the thermoelectric element including the metal substrate in FIG. 5.

Referring to FIG. 1, a thermoelectric element 100 includes a first resin layer 110, a plurality of first electrodes 120, a plurality of P-type thermoelectric legs 130, a plurality of N-type thermoelectric legs 140, a plurality of second electrodes 150, and a second resin layer 160.

The plurality of first electrodes 120 are disposed between the first resin layer 110 and lower surfaces of the plurality of P-type thermoelectric legs 130 and the plurality of N-type thermoelectric legs 140, and the plurality of second electrodes 150 are disposed between the second resin layer 160 and upper surfaces of the plurality of P-type thermoelectric legs 130 and the plurality of N-type thermoelectric legs 140. Accordingly, the plurality of P-type thermoelectric legs 130 and the plurality of N-type thermoelectric legs 140 are electrically connected by the plurality of first electrodes 120 and the plurality of second electrodes 150. A pair of the P-type thermoelectric leg 130 and the N-type thermoelectric leg 140 which are disposed between the first electrode 120 and the second electrode 150 and electrically connected to each other may form a unit cell.

The pair of the P-type thermoelectric leg 130 and the N-type thermoelectric leg 140 may be disposed on each of the first electrodes 120, and a pair of the P-type thermoelectric leg 130 and the N-type thermoelectric leg 140 may be disposed on the second electrode 150 to overlap one of the pair of the P-type thermoelectric leg 130 and the N-type thermoelectric leg 140 disposed on the first electrode 120.

Here, when a voltage is applied to the first electrode 120 and the second electrode 150, a substrate through which current flows from the P-type thermoelectric legs 130 to the N-type thermoelectric legs 140 due to the Peltier effect may absorb heat to function as a cooling part, and a substrate through which current flows from the N-type thermoelectric legs 140 to the P-type thermoelectric legs 130 may be heated to function as a heating part. Alternatively, when a temperature difference between the first electrode 120 and the second electrode 150 is applied, charges in the P-type thermoelectric legs 130 and the N-type thermoelectric legs 140 move due to the Seebeck effect, and electricity may be generated.

Here, the P-type thermoelectric legs 130 and the N-type thermoelectric legs 140 may be bismuth telluride (Bi—Te)-based thermoelectric legs including bismuth (Bi) and tellurium (Te) as main raw materials. The P-type thermoelectric legs 130 may be thermoelectric legs including a bismuth telluride (Bi—Te)-based main raw material in an amount of 99 to 99.999 wt % including at least one among antimony (Sb), nickel (Ni), aluminum (Al), copper (Cu), silver (Ag), lead (Pb), boron (B), gallium (Ga), tellurium (Te), bismuth (Bi), and indium (In), and a 0.001 to 1 wt % mixture including Bi or Te based on the total weight of 100 wt %. For example, the main raw material may be Bi—Se—Te, and may further include Bi or Te in an amount of 0.001 to 1 wt % of the total weight. The N-type thermoelectric legs 140 may be thermoelectric legs including a bismuth telluride (Bi—Te)-based main raw material in an amount of 99 to 99.999 wt % including at least one among selenium (Se), nickel (Ni), aluminum (Al), copper (Cu), silver (Ag), lead (Pb), boron (B), gallium (Ga), tellurium (Te), bismuth (Bi), and indium (In), and a 0.001 to 1 wt % mixture including Bi or Te based on the total weight of 100 wt %. For example, the main raw material may be Bi—Sb—Te, and may further include Bi or Te in an amount of 0.001 to 1 wt % of the total weight.

The P-type thermoelectric legs 130 and the N-type thermoelectric legs 140 may be formed in a bulk type or a stacked type. Generally, the bulk type P-type thermoelectric legs 130 or the bulk type N-type thermoelectric legs 140 may be obtained through a process of producing an ingot by heat-treating a thermoelectric material, pulverizing and sieving the ingot to obtain powder for thermoelectric legs, and then sintering the powder and cutting the sintered object. The stacked type P-type thermoelectric legs 130 or the stacked type N-type thermoelectric legs 140 may be obtained through a process of forming a unit member by applying a paste including the thermoelectric material on a sheet-shaped base material, and then stacking and cutting the unit member.

In this case, the pair of the P-type thermoelectric leg 130 and the N-type thermoelectric leg 140 may have the same shape and volume, or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

The performance of the thermoelectric element according to one embodiment of the present invention may be expressed as a thermoelectric performance index. The thermoelectric performance index (ZT) may be expressed as in Equation 1.

$$ZT = \alpha^2 \cdot \sigma \cdot T/k \qquad \text{[Equation 1]}$$

Here, $\alpha$ is the Seebeck coefficient [V/K], $\sigma$ is electrical conductivity [S/m], and $\alpha 2\sigma$ is a power factor (W/mK2]). Further, T is a temperature, and k is thermal conductivity [W/mK]. k may be expressed as $a \cdot cp \cdot \rho$, wherein a is thermal diffusivity [cm2/S], cp is specific heat [J/gK], and $\rho$ is density [g/cm3].

In order to obtain the thermoelectric performance index of the thermoelectric element, a Z value (V/K) is measured using a Z meter, and the Seebeck index (ZT) may be calculated using the measured Z value.

Here, the plurality of first electrodes 120 disposed between the first resin layer 110 and the P-type thermoelectric legs 130 and the N-type thermoelectric legs 140, and the plurality of second electrodes 150 disposed between the second resin layer 160 and the P-type thermoelectric legs 130 and the N-type thermoelectric legs 140 may each include at least one of copper (Cu), silver (Ag), and nickel (Ni).

Further, the first resin layer 110 and the second resin layer 160 may have different sizes. For example, a volume, a thickness, or an area of one of the first resin layer 110 and the second resin layer 160 may be formed larger than a volume, a thickness, or an area of the other one. Accordingly, it is possible to increase the heat absorption performance or the heat dissipation performance of the thermoelectric element.

In this case, the P-type thermoelectric leg 130 or the N-type thermoelectric leg 140 may have a cylindrical shape, a polygonal pillar shape, an elliptical pillar shape, and the like.

Alternatively, the P-type thermoelectric leg 130 or the N-type thermoelectric leg 140 may have a stacked structure. For example, the P-type thermoelectric legs or the N-type thermoelectric legs may be formed by a method of stacking a plurality of structures coated with a semiconductor material on a sheet-shaped base material, and then cutting the structures. Accordingly, material loss may be prevented and an electrical conduction characteristic may be enhanced.

Alternatively, the P-type thermoelectric leg 130 or the N-type thermoelectric leg 140 may be manufactured according to a zone melting method or a powder sintering method. According to the zone melting method, after manufacturing the ingot using the thermoelectric material, heat is slowly applied to the ingot to refine particles so that the particles are rearranged in a single direction, and the thermoelectric leg is obtained by a slow-cooling method. According to the powder sintering method, the thermoelectric leg is obtained through a process of pulverizing and sieving the ingot to obtain powder for thermoelectric legs and sintering the powder after manufacturing the ingot using the thermoelectric material.

According to the embodiment of the present invention, the first resin layer 110 may be disposed on a first metal substrate 170 to be in direct contact with the first metal substrate 170, and the second resin layer 160 may be disposed on a second metal substrate 180 to be in direct contact with the second metal substrate 180.

The first metal substrate 170 and the second metal substrate 180 may be formed of aluminum, an aluminum alloy, copper, a copper alloy, an aluminum-copper alloy, or the like. The first metal substrate 170 and the second metal substrate 180 may support the first resin layer 110, the plurality of first electrodes 120, the plurality of P-type thermoelectric legs 130, the plurality of N-type thermoelectric legs 140, the plurality of second electrodes 150, the second resin layer 160, and the like, and at least one of the first metal substrate 170 and the second metal substrate 180 may be a region directly attached to an application to which the thermoelectric element 100 according to the embodiment of the present invention is applied. Accordingly, the first metal substrate 170 and the second metal substrate 180 may be interchanged with a first metal support and a second metal support, respectively.

An area of the first metal substrate 170 may be larger than an area of the first resin layer 110, and an area of the second metal substrate 180 may be larger than an area of the second resin layer 160. That is, the first resin layer 110 may be disposed in a region spaced apart from an edge of the first metal substrate 170 by a predetermined distance, and the second resin layer 160 may be disposed in a region spaced apart from an edge of the second metal substrate 180 by a predetermined distance.

In this case, a width of the first metal substrate 170 may be larger than a width of the second metal substrate 180, or a thickness of the second metal substrate 180 may be larger than a thickness of the first metal substrate 170. Alternatively, a total area of the first metal substrate 170 may be larger than a total area of the second metal substrate 180. The first metal substrate 170 may be a heat dissipating part which emits heat, and the second metal substrate 180 may be a heat absorbing part which absorbs heat. To this end, a plurality of protruding patterns may be disposed on at least one surface of a surface opposite a surface on which the first resin layer 110 is disposed among both surfaces of the first metal substrate 170 and a surface opposite a surface on which the second resin layer 160 is disposed among both surfaces of the second metal substrate 180. The protruding pattern may be a heat sink.

The first resin layer 110 and the second resin layer 160 may be formed of a resin composition including a polymer resin and an inorganic filler. Here, the polymer resin may be any material including a polymer material to which a function of insulation, adhesion, or heat dissipation is provided. For example, the polymer resin may be one selected from an epoxy resin, an acrylic resin, a urethane resin, a polyamide resin, a polyethylene resin, an ethylene-vinyl acetate copolymer (EVA) resin, a polyester resin, and a polyvinyl chloride (PVC) resin. Preferably, the polymer resin may be an epoxy resin. Here, the epoxy resin may be included in an amount of 20 to 40 wt %, and the inorganic filler may be included in an amount of 60 to 80 wt %. When the inorganic filler is included in an amount less than 60 wt %, a heat conduction effect may be low, and when the inorganic filler is included over 80 wt %, adhesion between the resin layer and the metal substrate may be lowered, and the resin layer may be easily broken.

The first resin layer 110 and the second resin layer 160 may include the same material, thicknesses of the first resin layer 110 and the second resin layer 160 may each be 20 to 200 μm, and thermal conductivity may be 1 W/mK or more, preferably, 10 W/mK or more, and more preferably, 20 W/mK or more. In the case in which the thicknesses of the first resin layer 110 and the second resin layer 160 satisfy this numerical range, bonding between the first resin layer 110 and the first metal substrate 170 and bonding between the second resin layer 160 and the second metal substrate 180 may not be affected even when the first resin layer 110 and the second resin layer 160 repeat contraction and expansion according to a temperature change.

To this end, the epoxy resin may include an epoxy compound and a curing agent. In this case, the curing agent may be included in a volume ratio of 1 to 10 with respect to a volume ratio of 10 of the epoxy compound. Here, the epoxy compound may include at least one of a crystalline epoxy compound, an amorphous epoxy compound, and a silicone epoxy compound. The crystalline epoxy compound may include a mesogen structure. A mesogen is a basic unit of liquid crystal, and includes a rigid structure. Further, the amorphous epoxy compound may be a general amorphous epoxy compound having two or more epoxy groups in a molecule, and may be, for example, glycidyl ethers derived from bisphenol A or bisphenol F. Here, the curing agent may include at least one of an amine-based curing agent, a phenolic curing agent, an acid anhydride-based curing agent, a polymercaptan-based curing agent, a polyaminoamide-based curing agent, an isocyanate-based curing agent, and a block isocyanate curing agent, and two or more types of the curing agents may be mixed and used.

The inorganic filler may include aluminum oxide or nitride, and the aluminum nitride may be included in an amount of 55 to 95 wt % of the inorganic filler, and more preferably, 60 to 80 wt %. When the nitride is included in this numerical range, thermal conductivity and bonding strength may be enhanced. Here, the nitride may include at least one of boron nitride and aluminum nitride. Here, the boron nitride may be plate-shaped boron nitride or a boron nitride agglomerate in which the plate-shaped boron nitride is agglomerated, and a surface of the boron nitride may be coated with the polymer resin. Here, any polymer resin which can be combined with boron nitride or can coat the surface of boron nitride can be used. The polymer resin may be, for example, selected from the group consisting of an acrylic polymer resin, an epoxy polymer resin, a urethane polymer resin, a polyamide polymer resin, a polyethylene polymer resin, an ethylene vinyl acetate copolymer (EVA) polymer resin, a polyester polymer resin, and a polyvinyl chloride (PVC) polymer resin. Further, the polymer resin may be a polymer resin having the following Unit 1.

The Unit 1 is as follows.

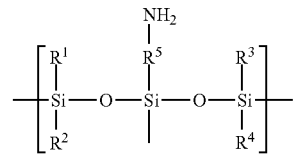

[Unit 1]

Here, one of R1, R2, R3 and R4 may be H, and the others may be selected from the group consisting of C1-C3 alkyl, C2-C3 alkene and C2-C3 alkyne, and R5 may be a linear, branched or cyclic divalent organic linker having 1 to 12 carbon atoms.

In one embodiment, one of the remainder among R1, R2, R3, and R4 except for H may be selected from C2-C3 alkene, and the other and another one of the remainder may be selected from C1-C3 alkyl. For example, the polymer resin according to the embodiment of the present invention may include the following Unit 2.

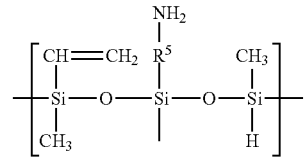

[Unit 2]

Alternatively, the remainder among R1, R2, R3, and R4 except for H may be selected from the group consisting of C1-C3 alkyl, C2-C3 alkene and C2-C3 alkyne to be different from each other.

As described above, when the polymer resin according to the Unit 1 or the Unit 2 is coated on boron nitride, it becomes easy to form a functional group, and when a functional group is formed on boron nitride, affinity with the resin may increase.

In this case, a particle size (D50) of the boron nitride may be larger than a particle size (D50) of the aluminum oxide. For example, the particle size (D50) of the boron nitride may be 40 to 200 μm, and the particle size (D50) of the aluminum oxide may be 10 to 30 μm. When the particle size (D50) of the boron nitride and the particle size (D50) of the aluminum oxide satisfy these numerical ranges, the boron nitride and the aluminum oxide may be uniformly dispersed in the epoxy resin composition, and accordingly, it is possible to have a uniform heat conduction effect and adhesion performance throughout the resin layer.

As described above, when the first resin layer 110 is disposed between the first metal substrate 170 and the plurality of first electrodes 120, heat may be transferred between the first metal substrate 170 and the plurality of first electrodes 120 without a separate ceramic substrate, and a separate adhesive or physical fastening means is not required due to the adhesive performance of the first resin layer 110 itself. Specifically, since the first resin layer 110 may be implemented with a significantly thinner smaller than a conventional ceramic substrate, the heat transfer performance between the plurality of first electrodes 120 and the first metal substrate 170 may be improved, and an overall size of the thermoelectric element 100 may also be reduced.

Here, the first metal substrate 170 may be in direct contact with the first resin layer 110. To this end, surface roughness may be formed on the surface on which the first resin layer 110 is disposed among both surfaces of the first metal substrate 170, that is, the surface of the first metal substrate 170 facing the first resin layer 110. Accordingly, a problem in that the first resin layer 110 is lifted when the first metal substrate 170 and the first resin layer 110 are thermally compressed may be prevented. In this specification, surface roughness refers to unevenness and may be interchanged with surface coarseness.

Referring to FIGS. 2 to 4, the surface on which the first resin layer 110 is disposed among both surfaces of the first metal substrate 170, that is, the surface of the first metal substrate 170 facing the first resin layer 110, may include a first region 172 and a second region 174, and the second region 174 may be disposed in the first region 172. That is, the first region 172 may be disposed within a predetermined distance from the edge of the first metal substrate 170 toward the center region, and the first region 172 may surround the second region 174.

In this case, a surface roughness of the second region 174 may be larger than a surface roughness of the first region 172, and the first resin layer 110 may be disposed on the second region 174. Here, the first resin layer 110 may be disposed to be spaced apart by a predetermined distance from a boundary between the first region 172 and the second region 174. That is, the first resin layer 110 may be disposed on the second region 174, and the edge of the first resin layer 110 may be located in the second region 174. Accordingly, in at least a part of grooves 400 formed by the surface roughness of the second region 174, a part of the first resin layer 110, that is, an epoxy resin 600 and a part 604 of the inorganic filler included in the first resin layer 110 may permeate, and adhesion between the first resin layer 110 and the first metal substrate 170 may increase.

However, the surface roughness of the second region 174 may be larger than the particle size (D50) of a portion of the inorganic filler included in the first resin layer 110 and smaller than the particle size (D50) of the other portion of the inorganic filler. Here, the particle size (D50) may refer to a particle diameter corresponding to 50% of a weight percentage in a particle size distribution curve, that is, a particle diameter at which a passing mass percentage becomes 50%, and may be interchanged with an average particle diameter. In an example in which the first resin layer 110 includes aluminum oxide and boron nitride as inorganic fillers, the aluminum oxide does not affect the adhesion performance between the first resin layer 110 and the first metal substrate 170, but since the boron nitride has a smooth surface, the adhesion performance between the first resin layer 110 and the first metal substrate 170 may be adversely affected. Accordingly, when the surface roughness of the second region 174 is formed to be larger than the particle size (D50) of the aluminum oxide included in the first resin layer 110, and smaller than the particle size (D50) of the boron nitride, since only the aluminum oxide is disposed in the grooves formed by the surface roughness of the second region 174, and it is difficult for the boron nitride to be disposed therein, the first resin layer 110 and the first metal substrate 170 may maintain high bonding strength.

Accordingly, the surface roughness of the second region 174 may be 1.05 to 1.3 times the particle size (D50) of an inorganic filler 604 having a relatively small size among the inorganic fillers included in the first resin layer 110, for example, the aluminum oxide, and may be smaller than the particle size (D50) of an inorganic filler 602 having a relatively large size among the inorganic fillers included in the first resin layer 110, for example, the boron nitride. For example, the surface roughness of the second region 174 may be smaller than 40 μm, preferably, 10.5 to 39 μm. Accordingly, the boron nitride disposed in the grooves formed by the surface roughness of the second region 174 may be minimized.

The surface roughness may be measured using a surface roughness meter. The surface roughness meter measures a cross-sectional curve using a probe, and may calculate the surface roughness using a peak line, a valley bottom line, an average line, and a reference length of the cross-sectional curve. In this specification, the surface roughness may refer to arithmetic average roughness (Ra) by a center line average calculation method. The arithmetic average roughness (Ra) may be obtained through the following Equation 2.

$$R_a = \frac{1}{L}\int_0^L |f(x)|dx \qquad \text{[Equation 2]}$$

That is, when the cross-sectional curve obtained by the probe of the surface roughness meter is extracted as much as a reference length L and expressed as the function (f(x)) with an average line direction set to an x-axis and a height direction set to a y-axis, the value obtained by Equation 2 may be expressed in micrometers.

According to another embodiment of the present invention, referring to FIGS. 5 and 6, a surface on which a first resin layer 110 is disposed among both surfaces of a first metal substrate 170, that is, a surface of the first metal substrate 170 facing the first resin layer 110 may include a first region 172 and a second region 174 surrounded by the first region 172 and having a larger surface roughness than the first region 172, and may further include a third region 176.

Here, the third region 176 may be disposed in the second region 174. That is, the third region 176 may be disposed to be surrounded by the second region 174. Further, the surface roughness of the second region 174 may be formed larger than a surface roughness of the third region 176.

In this case, the first resin layer 110 is disposed to be spaced apart from a boundary between the first region 172 and the second region 174 by a predetermined distance, and may be disposed to cover a portion of second region 174 and the third region 176.

Meanwhile, referring to FIG. 1 again, at least portions of the side surfaces 121 of the plurality of first electrodes 120 are embedded in the first resin layer 110. In this case, heights H1 of the side surfaces 121 of the plurality of first electrodes 120 embedded in the first resin layer 110 are 0.1 to 1 time, preferably, 0.2 to 0.9 times, and more preferably 0.3 to 0.8 times a thickness H of each of the plurality of first electrodes 120. As described above, when the at least portions of the side surfaces 121 of the plurality of first electrodes 120 are embedded in the first resin layer 110, a contact area between the plurality of first electrodes 120 and the first resin layer 110 increases, and accordingly, the heat transfer performance and bonding strength between the plurality of first electrodes 120 and the first resin layer 110 may further increase. When the heights H1 of the side surfaces 121 of the plurality of first electrodes 120 embedded in the first resin layer 110 are smaller than 0.1 times the thickness H of each of the plurality of first electrodes 120, it may difficult to sufficiently obtain the heat transfer performance and bonding strength between the plurality of first electrodes 120 and the first resin layer 110, and when the heights H1 of the side surfaces 121 of the plurality of first electrodes 120 embedded in the first resin layer 110 are larger than 1 time the thickness H of each of the plurality of first electrodes 120, the first resin layer 110 may rise on the plurality of first electrodes 120, and accordingly, an electrical short circuit may occur.

More specifically, a thickness of the first resin layer 110 between two neighboring first electrodes 120 may decrease from the side surface of each of the electrodes to a center region. Here, the center region may refer to a predetermined region including a middle point between the two first electrodes 120. That is, the thickness of the first resin layer 110 may gradually decrease while being further away from the side surface of one first electrode 120, and may increase while approaching the side surface of the other neighboring first electrode 120. In this case, the thickness of the first resin layer 110 between the two neighboring first electrodes 120 may be gradually reduced and then increased. Accordingly, an upper surface of the first resin layer 110 between the two neighboring first electrodes 120 may have a 'V' shape with a smooth vertex. Accordingly, the first resin layer 110 between the two neighboring first electrodes 120 may have a thickness deviation. For example, a height T2 of the first resin layer 110 in a region in direct contact with the side surface 121 of the first electrode 120 is the highest, and a height T3 of the first resin layer 110 in the center region may be lower than the height T2 of the first resin layer 110 in the region in direct contact with the side surface 121 of the first electrode 120. That is, the height T3 of the first resin layer 110 in the center region between the two neighboring first electrodes 120 may be the lowest in the first resin layer 110 between the two neighboring first electrodes 120.

However, a height T1 of the first resin layer 110 under each first electrode 120 may be smaller than the height T3 of the first resin layer 110 in the center region between the two neighboring first electrodes 120. That is, when the height T2 of the first resin layer 110 in the region in direct contact with the side surface 121 of the first electrode 120, the height T3 of the first resin layer 110 in the center region between the two neighboring first electrodes 120, and the height T1 of the first resin layer 110 under each first electrode 120 are compared, a height deviation may occur in the order of T2>T3>T1.

The height deviation may be caused when air in a composition forming the first resin layer 110 in an uncured or a semi-cured state is discharged by thermal energy in a process of disposing the plurality of first electrodes 120 on the composition to press the composition, and then curing the composition forming the first resin layer 110. That is, the side surfaces of the plurality of first electrodes 120 may be channels through which the air in the composition forming the first resin layer 110 is discharged, and accordingly, the composition constituting the first resin layer 110 may be cured in a form descending in a gravity direction along the side surfaces of the plurality of first electrodes 120.

In this case, the thickness T1 of the first resin layer 110 under each of the plurality of first electrodes 120 may be 20 to 80 μm, and the thickness T2 of the first resin layer 110 in the region in direct contact with the side surface 121 of the first electrode 120 may be 1.5 to 4 times, preferably, 2 to 4 times, and more preferably, 3 to 4 times the thickness T1 of the first resin layer 110 under each first electrode 120. Further, the thickness T3 of the first resin layer 110 in the center region between the two neighboring first electrodes 120 may be 1.1 to 3 times, preferably, 1.1 to 2.5 times, and more preferably, 1.1 to 2 times the thickness T1 of the first resin layer 110 under each first electrode 120. In addition, the thickness T2 of the first resin layer 110 in the region in direct contact with the side surface 121 of the first electrode 120 may be 1.5 to 3.5 times, preferably, 2 to 3 times, and more preferably, 2.2 to 2.7 times the thickness T3 of the first resin layer 110 in the center region between the two neighboring first electrodes 120. As described above, when the thickness T1 of the first resin layer 110 under each of the plurality of first electrodes 120, the thickness T2 of the first resin layer 110 in the region in direct contact with the side surface 121 of the first electrode 120, and the thickness T3 of the first resin layer 110 in the center region between the two neighboring first electrodes 120 are different from each other, a distribution of the inorganic fillers in the first resin layer 110 under the plurality of first electrodes 120 may be different from a distribution of the inorganic fillers in the first resin layer 110 between the plurality of first electrodes 120. For example, in the case in which the first resin layer 110 includes the boron nitride having a D50 of 40 to 200 μm and the aluminum oxide having a D50 of 10 to 30 μm, even when the boron nitride and the aluminum oxide are uniformly dispersed in first resin layer 110 on the whole, the distribution may be partially different. For example, the density of the boron nitride having the D50 of 40 to 200 μm is approximately 2.1 g/cm3, and the density of the aluminum oxide having the D50 of 10 to 30 μm is approximately 3.95 to 4.1 g/cm3. Accordingly, the aluminum oxide having a high density and a small size, tends to sink down in comparison with the boron nitride having a relatively low density and a large size. Specifically, in the region disposed under the plurality of first electrodes 120 in the first resin layer 110, that is, in the region having the thickness of T1, the inorganic filler having a larger particle size than that of the T1 may be pushed to the regions between the plurality of first electrodes 120, that is, the regions having the thickness of T2 to T3. Accordingly, the distribution of the inorganic fillers in the first resin layer 110 under the plurality of first electrodes 120 may be different from the distribution of the inorganic fillers in the first resin layer 110 between the plurality of first electrodes 120. For example, a content ratio (for example, a weight ratio) of the boron nitride to the total inorganic filler in the first resin layer 110 under the plurality of first electrodes 120 may be smaller than a content ratio (for example, a weight ratio) of the boron nitride to the total inorganic filler in the first resin layer 110 between the plurality of first electrodes 120. Accordingly, the particle size (D50) of the inorganic filler in the first resin layer 110 under the plurality of first electrodes 120 may be smaller than the particle size (D50) of the inorganic filler in the first resin layer 110 between the plurality of first electrodes 120. The aluminum oxide may not affect the adhesion performance between the first resin layer 110 and the plurality of first electrodes 120, but the boron nitride has a smooth surface, and thus may adversely affect the adhesion performance between the first resin layer 110 and the plurality of first electrodes 120. Like the embodiment of the present invention, when the plurality of first electrodes 120 are embedded in the first resin layer 110, the content of the boron nitride in the first resin layer 110 disposed under the plurality of first electrodes 120 is reduced, and accordingly, the bonding strength between the plurality of first electrodes 120 and the first resin layer 110 may increase in comparison with a case in which the plurality of first electrodes 120 are not embedded in the first resin layer 110.

Figure 7:
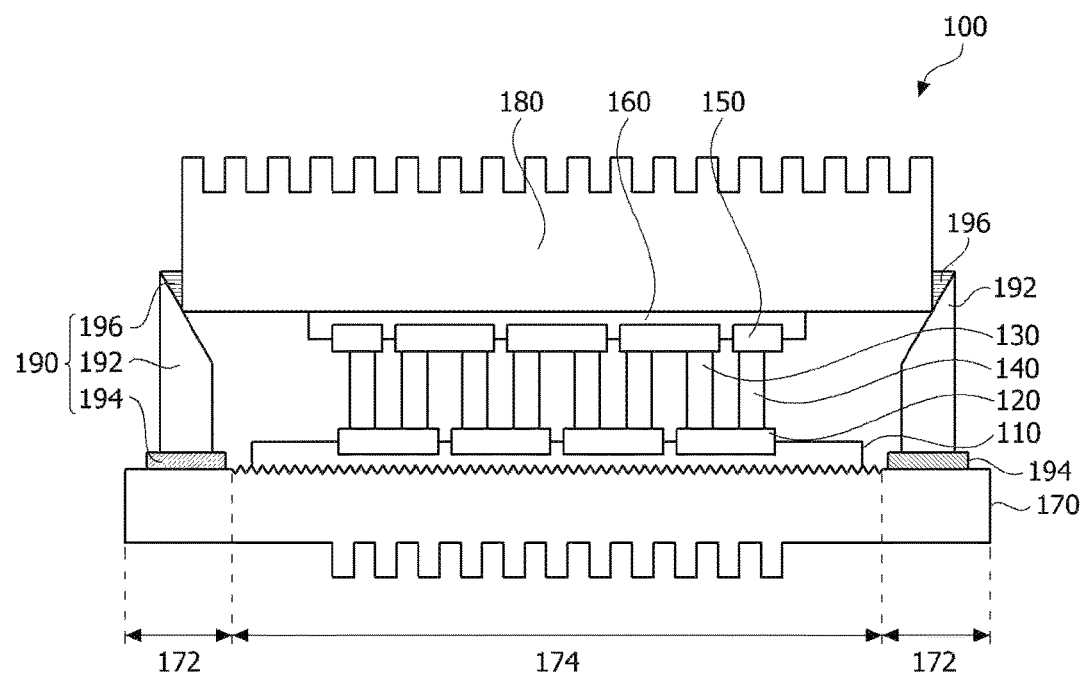
FIG. 7 is a cross-sectional view of a thermoelectric element according to still another embodiment of the present invention.
Figure 8:
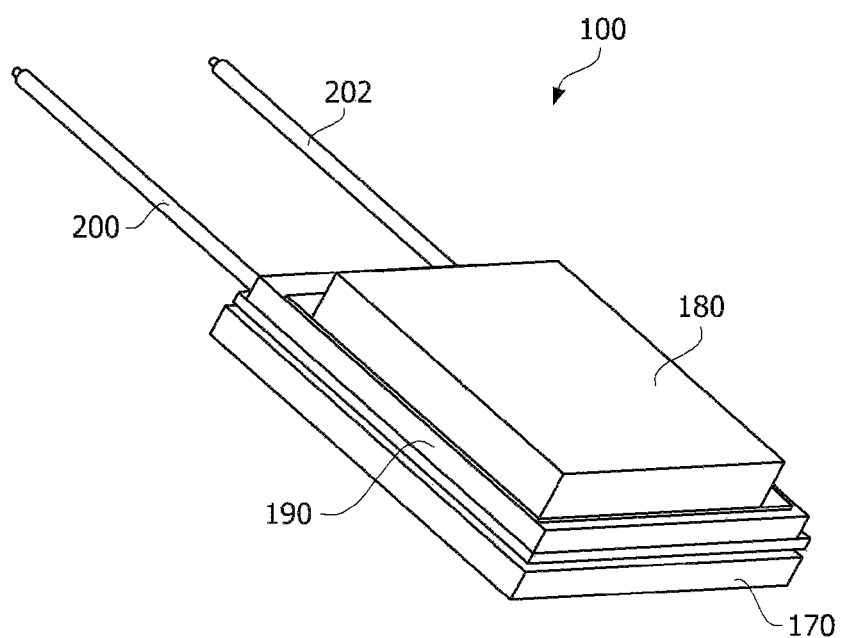
FIG. 8 is a perspective view of the thermoelectric element according to FIG. 7.
Figure 9:
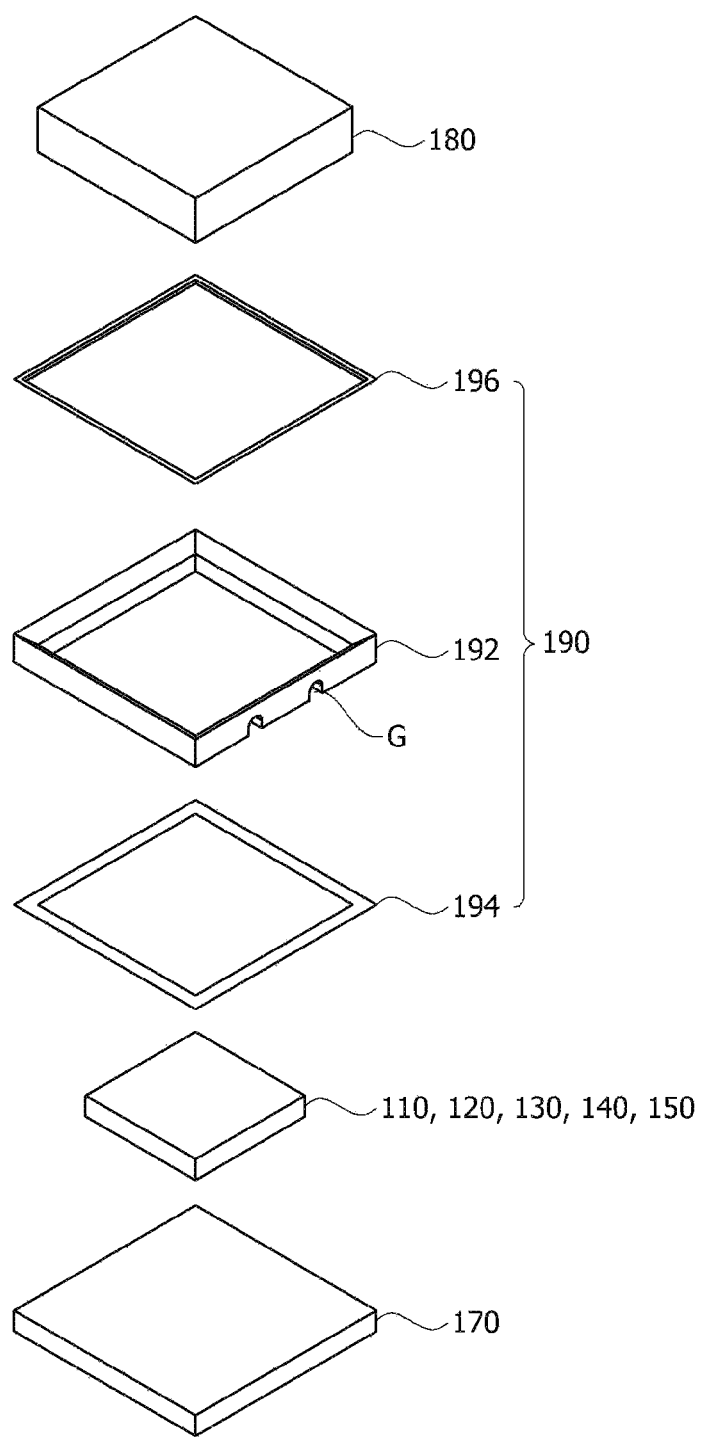
FIG. 9 is an exploded perspective view of the thermoelectric element according to FIG. 7.

FIG. 7 is a cross-sectional view of a thermoelectric element according to still another embodiment of the present invention, FIG. 8 is a perspective view of the thermoelectric element according to FIG. 7, and FIG. 9 is an exploded perspective view of the thermoelectric element according to FIG. 7. Contents the same as the contents described in FIGS. 1 to 6 will be omitted.

Referring to FIGS. 7 to 9, a thermoelectric element 100 according to the embodiment of the present invention includes a sealing part 190.

The sealing part 190 may be disposed at a side surface of the first resin layer 110 on the first metal substrate 170 and a side surface of the second resin layer 160. That is, the sealing part 190 may be disposed between the first metal substrate 170 and the second metal substrate 180, and may be disposed to surround the outermost portions of the plurality of first electrodes 120, the outermost portions of the plurality of P-type thermoelectric legs 130 and the plurality of N-type thermoelectric legs 140, the outermost portions of the the of the plurality of second electrodes 150, and the side surfaces of the second resin layer 160. Accordingly, the first resin layer 110, the plurality of first electrodes 120, the plurality of P-type thermoelectric legs 130, the plurality of N-type thermoelectric legs 140, the plurality of second electrodes 150, and the second resin layer may be sealed from external moisture, heat, contamination, and the like.

In this case, the sealing part 190 may be disposed on the first region 172. As described above, when the sealing part 190 is disposed on the first region 172 having small surface roughness, a sealing effect between the sealing part 190 and the first metal substrate 170 may be enhanced.

Here, the sealing part 190 may include a sealing case 192 disposed to be spaced apart from the side surfaces of the first resin layer 110, the outermost portions of the plurality of first electrodes 120, the outermost portions of the plurality of P-type thermoelectric legs 130 and the plurality of N-type thermoelectric legs 140, the outermost portions of the plurality of second electrodes 150, and the side surfaces of the second resin layer 160 by predetermined distances, a sealing material 194 disposed between the sealing case 192 and the first region 172 of the first metal substrate 170, and a sealing material 196 disposed between the sealing case 192 and the side surface of the second metal substrate 180. As described above, the sealing case 192 may come into contact with the first metal substrate 170 and the second metal substrate 180 through the sealing materials 194 and 196. Accordingly, when the sealing case 192 comes into direct contact with the first metal substrate 170 and the second metal substrate 180, thermal conduction occurs through the sealing case 192, and accordingly, it is possible to prevent a problem in that ΔT is lowered. Specifically, according to the embodiment of the present invention, a portion of an inner wall of the sealing case 192 is formed to be inclined, and the sealing material 196 is disposed between the second metal substrate 180 and the sealing case 192 at the side surface of the second metal substrate 180. Accordingly, a contact area between the sealing case 192 and the second metal substrate 180 may be minimized, and since a volume between the first metal substrate 170 and the second metal substrate 180 increases, heat exchange becomes active, and thus a higher ΔT can be obtained.

Here, the sealing materials 194 and 196 may include at least one of an epoxy resin and a silicone resin, or a tape having at least one of an epoxy resin and a silicone resin coated on both side surfaces thereof. The sealing materials 194 and 196 may serve to impart airtightness between the sealing case 192 and the first metal substrate 170 and between the sealing case 192 and the second metal substrate 180, may enhance the sealing effect of the first resin layer 110, the plurality of first electrodes 120, the plurality of P-type thermoelectric legs 130, the plurality of N-type thermoelectric legs 140, the plurality of second electrodes 150 and the second resin layer 160, and may be interchanged with finishing material, finishing layer, waterproofing material, waterproofing layer, and the like.

Meanwhile, guide grooves G for drawing out wires 200 and 202 connected to the electrodes may be formed in the sealing case 192. To this end, the sealing case 192 may be an injection-molded product formed of plastic or the like, and may be interchanged with a sealing cover.

Here, the first metal substrate 170 may be a heat dissipating part or a heating part which radiates heat, and the second metal substrate 180 may be a heat absorbing part or a cooling part which absorbs heat. To this end, a width of the first metal substrate 170 may be larger than a width of the second metal substrate 180, or a thickness of the first metal substrate 170 may be smaller than a thickness of the second metal substrate 180. Accordingly, the first metal substrate 170 which is a heat dissipating part or a heating part may be implemented to have small thermal resistance, and the sealing part 190 may be stably disposed. Specifically, the first metal substrate 170 may be formed larger than the second metal substrate 180 by an area corresponding to the first region 172 to stably dispose the sealing part 190. The second metal substrate 180 which is a heat absorbing part or a cooling part may come into contact with an object for contact with a minimum area, and thus it is possible to minimize heat loss. When the thermoelectric element according to the embodiment of the present invention is applied to an application for cooling, the thickness of the second metal substrate 180 may vary according to a required heat capacity of a cooling system.

The embodiment described in FIGS. 7 to 9 may be applied to not only the embodiment in FIGS. 1 to 4 in which the first metal substrate 170 includes the first region 172 and the second region 174, but also the embodiment in FIGS. 5 and 6 in which the first metal substrate 170 includes the first region 172, the second region 174, and the third region 176.

Figure 10:
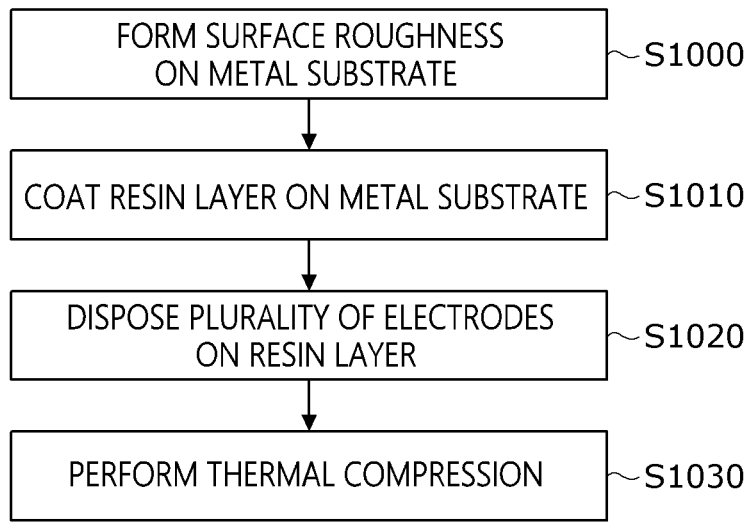
FIG. 10 illustrates a method of manufacturing the thermoelectric element according to one embodiment of the present invention.

FIG. 10 illustrates a method of manufacturing the thermoelectric element according to one embodiment of the present invention.

Referring to FIG. 10, the surface roughness is formed on one of both surfaces of a metal substrate (S1000). The surface roughness may be achieved by various methods such as sandblasting, sawing, casting, forging, turning, milling, boring, drilling, electric discharge machining, and the like, but the present invention is not limited thereto. As described above, the surface roughness may be achieved only in a partial region in one surface of both side surfaces of the metal substrate. For example, the surface roughness may be achieved in the remaining region including a center of the metal substrate, that is, a second region other than a partial region including an edge of the metal substrate, that is, a first region as in the embodiment of FIGS. 1 to 4. Alternatively, the surface roughness may be achieved in the remaining region, that is, a second region other than a partial region including an edge of the metal substrate, that is, a first region, and a partial region including a center of the metal substrate, that is, a third region as in the embodiment of FIGS. 5 and 6.

Further, a resin composition forming a resin layer, for example, an epoxy resin composition, is coated on the metal substrate (S1010). In this case, the epoxy resin composition may be coated to a thickness of 80 to 180 μm. In a state in which the resin layer is uncured or semi-cured, a plurality of electrodes are disposed on the resin layer (S1020). The plurality of electrodes may be disposed after being aligned in an array form. In this case, the plurality of electrodes may include a Cu layer, and may further include a Ni layer and an Au layer sequentially plated on the Cu layer, or may further include a Ni layer and an Sn layer sequentially plated on the Cu layer.

Further, thermal compression is performed under the metal substrate and over the plurality of electrodes (S1030). To this end, after the plurality of electrodes disposed in the array form on a film are disposed to face the resin layer in an uncured or semi-cured state, the thermal compression may be performed, and the film may be removed. Accordingly, the resin layer may be cured while portions of side surfaces of the plurality of electrodes are embedded in the resin layer.

Hereinafter, with reference to FIG. 11, an example in which the thermoelectric element according to the embodiment of the present invention is applied to a water purifier will be described.

Figure 11:
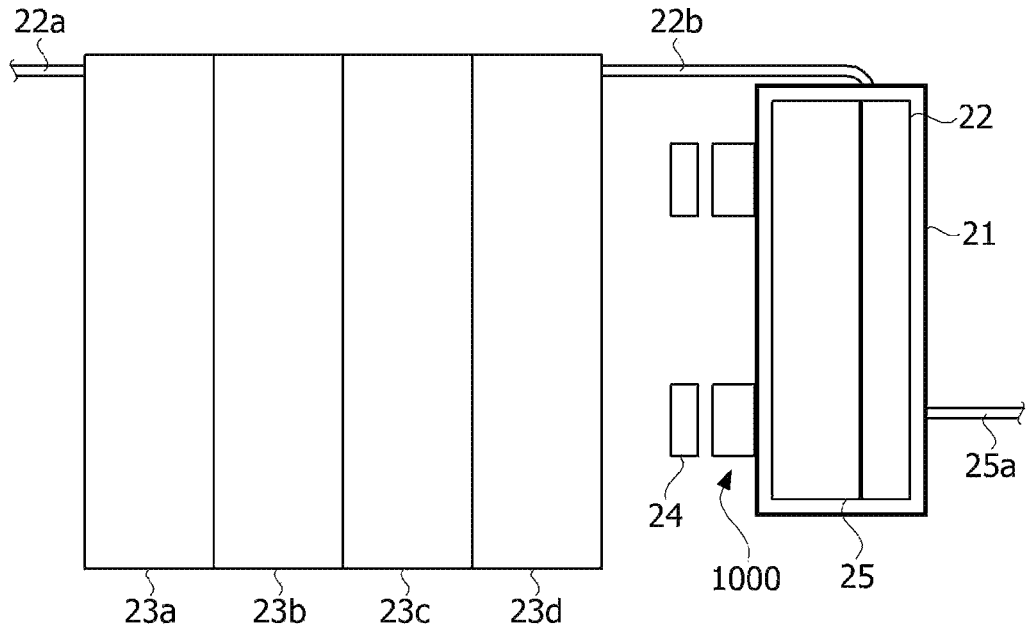
FIG. 11 is a block diagram of a water purifier to which the thermoelectric element according to the embodiment of the present invention is applied.

FIG. 11 is a block diagram of a water purifier to which the thermoelectric element according to the embodiment of the present invention is applied.

A water purifier 1 to which the thermoelectric element according to the embodiment of the present invention is applied includes a raw water supply pipe 12a, a purified water tank inlet pipe 12b, a purified water tank 12, a filter assembly 13, a cooling fan 14, and a heat storage tank 15, a cold water supply pipe 15a, and a thermoelectric device 1000.

The raw water supply pipe 12a is a supply pipe which introduces water to be purified into the filter assembly 13 from a water source, the purified water tank inlet pipe 12b is an inlet pipe which introduces the purified water from the filter assembly 13 into the purified water tank 12, and the cold water supply pipe 15a is a supply pipe through which cold water cooled to a predetermined temperature by the thermoelectric device 1000 in the purified water tank 12 is finally supplied to a user.

The purified water tank 12 temporarily accommodates the purified water to store the water purified through the filter assembly 13 and introduced through the purified water tank inlet pipe 12b and supply the water to the outside.

The filter assembly 13 is composed of a precipitation filter 13a, a pre-carbon filter 13b, a membrane filter 13c, and a post-carbon filter 13d.

That is, the water introduced into the raw water supply pipe 12a may be purified through the filter assembly 13.

The heat storage tank 15 is disposed between the purified water tank 12 and the thermoelectric device 1000 to store cold air generated in the thermoelectric device 1000. The cold air stored in the heat storage tank 15 is applied to the purified water tank 12 to cool the water accommodated in the purified water tank 120.

The heat storage tank 15 may come into surface contact with the purified water tank 12 so that the cold air may be smoothly transferred.

As described above, the thermoelectric device 1000 includes a heat absorbing surface and a heating surface, and has one side which is cooled and the other side which is heated by the movement of electrons on a P-type semiconductor and an N-type semiconductor.

Here, the one side may be a side of the purified water tank 12 and the other side may be an opposite side of the purified water tank 12.

Further, as described above, the thermoelectric device 1000 has excellent waterproofing and dustproofing performance, and improved heat flow performance, and thus may efficiently cool the purified water tank 12 in the water purifier.

Hereinafter, with reference to FIG. 12, an example in which the thermoelectric element according to the embodiment of the present invention is applied to a refrigerator will be described.

Figure 12:
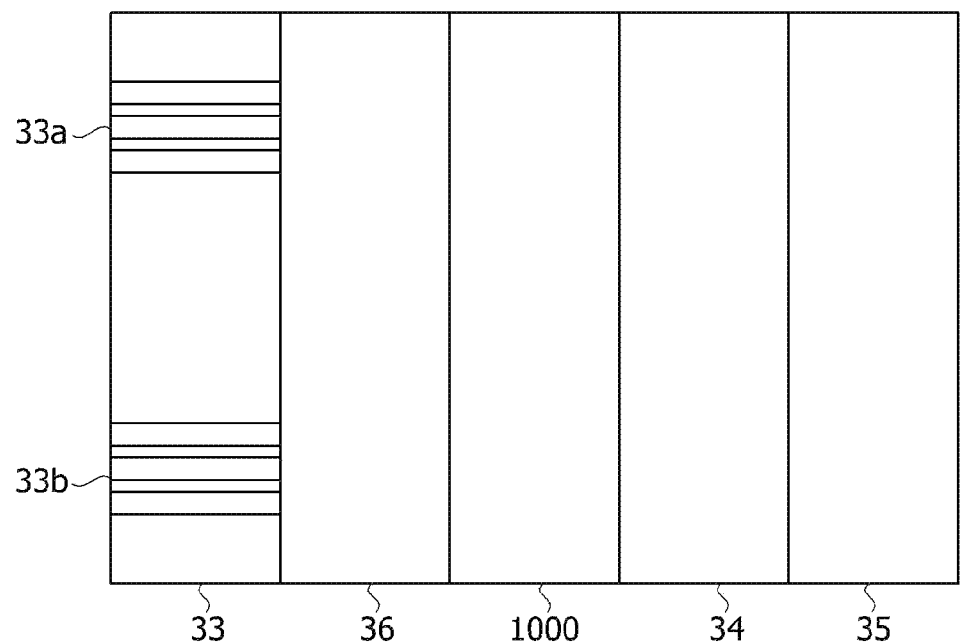
FIG. 12 is a block diagram of a refrigerator to which the thermoelectric element according to the embodiment of the present invention is applied.

FIG. 12 is a block diagram of a refrigerator to which the thermoelectric element according to the embodiment of the present invention is applied.

The refrigerator includes a deep temperature evaporation chamber cover 23, an evaporation chamber partition wall 24, a main evaporator 25, a cooling fan 26, and a thermoelectric device 1000 in a deep temperature evaporation chamber.

The inside of the refrigerator is partitioned into a deep temperature storage chamber and the deep temperature evaporation chamber by the deep temperature evaporation chamber cover 23.

Specifically, an inner space corresponding to a front of the deep temperature evaporation chamber cover 23 may be defined as the deep temperature storage chamber, and an inner space corresponding to a rear of the deep temperature evaporation chamber cover 23 may be defined as the deep temperature evaporation chamber.

A discharge grill 23a and a suction grill 23b may be formed on a front surface of the deep temperature evaporation chamber cover 23.

The evaporation chamber partition wall 24 is installed at a point spaced frontward from a rear wall of an inner cabinet, and partitions a space in which the deep temperature storage chamber is located and a space in which the main evaporator 25 is located.

The cold air cooled by the main evaporator 25 is supplied to a freezing chamber and then returns to the main evaporator.

The thermoelectric device 1000 is accommodated in the deep temperature evaporation chamber, and has a structure in which the heat absorbing surface faces a drawer assembly of the deep temperature storage chamber, and the heating surface faces the evaporator. Accordingly, a heat absorbing phenomenon generated by the thermoelectric device 1000 may be used to quickly cool food stored in the drawer assembly to a cryogenic state of minus 50° C.

Further, as described above, the thermoelectric device 1000 has excellent waterproofing and dustproofing performance, and improved heat flow performance, and thus may efficiently cool the drawer assembly in the refrigerator.

The thermoelectric element according to the embodiment of the present invention may be applied to a device for power generation, a device for cooling, a device for heating, and the like. Specifically, the thermoelectric element according to the embodiment of the present invention may be mainly applied to an optical communication module, a sensor, a medical device, a measuring device, aerospace industry, a refrigerator, a chiller, an automobile ventilation sheets, a cup holder, a washing machine, a dryer, a wine cellar, a water purifier, a power supply device for a sensor, a thermopile, and the like.

Here, as an example in which the thermoelectric element according to the embodiment of the present invention is applied to the medical device, there is a polymerase chain reaction (PCR) device. The PCR device is a device for amplifying deoxyribonucleic acid (DNA) to determine a nucleotide sequence of DNA, and demands precise temperature control and requires a thermal cycle. To this end, a Peltier-based thermoelectric element may be applied.

As another example in which the thermoelectric element according to the embodiment of the present invention is applied to the medical device, there is a photodetector. Here, the photodetector includes an infrared/ultraviolet ray detector, a charge coupled device (CCD) sensor, an X-ray detector, a thermoelectric thermal reference source (TTRS), and the like. The Peltier-based thermoelectric element may be applied for cooling the photo detector. Accordingly, it is possible to prevent a wavelength change, an output decrease, a resolution decrease, and the like due to a temperature increase in the photodetector.

As still another example in which the thermoelectric element according to the embodiment of the present invention is applied to the medical device, there is an immunoassay field, an in vitro diagnostics field, a general temperature control and cooling system, a physical therapy field, a liquid chiller system, a blood/plasma temperature control field, or the like. Accordingly, precise temperature control is possible.

As yet another example in which the thermoelectric element according to the embodiment of the present invention is applied to the medical device, there is an artificial heart. Accordingly, power may be supplied to the artificial heart.

As an example in which the thermoelectric element according to the embodiment of the present invention is applied to the aerospace industry, there is a star tracking system, a thermal imaging camera, an infrared/ultraviolet detector, a CCD sensor, a Hubble space telescope, a TTRS, or the like. Accordingly, it is possible to maintain a temperature of an image sensor.

As another example in which the thermoelectric element according to the embodiment of the present invention is applied to the aerospace industry, there is a cooling device, a heater, a power generation device, or the like.

In addition, the thermoelectric element according to the embodiment of the present invention may be applied to other industrial fields for power generation, cooling, and heating.

Although the exemplary embodiments of the present invention have been described above, it may be understood by those skilled in the art that a variety of modifications and changes may be made without departing from the concept and scope of the present invention disclosed within the range of the following claims.

The invention claimed is:

1. A thermoelectric element comprising:
a first metal substrate;
a first insulating layer disposed on the first metal substrate, and in direct contact with the first metal substrate;
a plurality of first electrodes disposed on the first insulating layer;
a plurality of semiconductor structures disposed on the plurality of first electrodes,
a plurality of second electrodes disposed on the plurality of semiconductor structures;
a second insulating layer disposed on the plurality of second electrodes; and
a second metal substrate disposed on the second insulating layer,
wherein at least some of side surfaces of the plurality of first electrodes are embedded in the first insulating layer,
wherein a thickness of the first insulating layer disposed between two neighboring first electrodes of the plurality of first electrodes decreases from each of side surfaces of the two neighboring first electrodes to a center region between the two neighboring first electrodes,
wherein an upper surface of the first insulating layer disposed between the two neighboring first electrodes is concave toward the first metal substrate, and
wherein a shortest distance between the first metal substrate and the upper surface of the first insulating layer disposed between the two neighboring first electrodes is greater than a distance between the first metal substrate and an upper surface of the first insulating layer disposed under one of the plurality of first electrodes and is less than a distance between the first metal substrate and an upper surface of the one of the plurality of first electrodes.

2. The thermoelectric element of claim 1,
wherein heights of the side surfaces of the plurality of first electrodes embedded in the first insulating layer is 0.2 to 0.9 times a thickness of the plurality of first electrodes.

3. The thermoelectric element of claim 1,
wherein the side surfaces of the plurality of first electrodes that are not embedded in the first insulating layer is exposed to an outside of the first insulating layer.

4. The thermoelectric element of claim 1,
wherein a thickness of the first insulating layer under the plurality of first electrodes is smaller than a thickness of the first insulating layer in the center region between the two neighboring first electrodes.

5. The thermoelectric element of claim 4,
wherein the first insulating layer includes a polymer and an inorganic filler, and
wherein a distribution of the inorganic filler in the first insulating layer under the plurality of first electrodes is different from a distribution of the inorganic filler in the first insulating layer between the two neighboring first electrodes.

6. The thermoelectric element of claim 4, wherein the thickness of the first insulating layer under the plurality of first electrodes is 20 μm to 80 μm.

7. The thermoelectric element of claim 1,
wherein a surface of the first metal substrate facing the first insulating layer includes a first region and a second region disposed in the first region, a surface roughness of the second region is greater than a surface roughness of the first region, and the first insulating layer is disposed on the second region.

8. The thermoelectric element of claim 7, further comprising a sealing part disposed between the first metal substrate and the second metal substrate,
wherein the sealing part is disposed on the first region.

9. The thermoelectric element of claim 8,
wherein the sealing part includes a sealing case disposed to be spaced apart from a side surface of the first insulating layer and a side surface of the second insulating layer by a predetermined distance, and a sealing material disposed between the sealing case and the first region.

10. The thermoelectric element of claim 1,
wherein the first insulating layer includes the polymer resin in an amount of 20 to 40 wt % and the inorganic filler in an amount of 60 to 80 wt %.

11. The thermoelectric element of claim 10,
wherein the polymer resin may include at least one of an epoxy resin, an acrylic resin, a urethane resin, a polyamide resin, a polyethylene resin, an ethylene-vinyl acetate copolymer (EVA) resin, a polyester resin, and a polyvinyl chloride (PVC) resin, and the inorganic filler may include at least one of aluminum oxide, boron nitride, and aluminum nitride.

12. The thermoelectric element of claim 1,
wherein the second insulating layer includes the same material as the first insulating layer.

13. The thermoelectric element of claim 6,
wherein the thickness of the first insulating layer in the central region between the two neighboring first electrodes is 1.1 to 3 times the thickness of the first insulating layer under the plurality of first electrodes.

* * * * *